(12) United States Patent
Ishikawa et al.

(10) Patent No.: US 7,298,265 B2
(45) Date of Patent: Nov. 20, 2007

(54) RFID TAG AND METHOD OF MANUFACTURING THE SAME

(75) Inventors: Naoki Ishikawa, Kawasaki (JP); Shunji Baba, Kawasaki (JP); Hidehiko Kira, Kawasaki (JP); Hiroshi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 199 days.

(21) Appl. No.: 11/091,934

(22) Filed: Mar. 29, 2005

(65) Prior Publication Data

US 2006/0131426 A1  Jun. 22, 2006

(30) Foreign Application Priority Data

Dec. 2, 2004  (JP) ............... 2004-349236

(51) Int. Cl.
*G08B 13/14* (2006.01)
(52) U.S. Cl. .................... 340/572.1; 235/492
(58) Field of Classification Search .......... 235/492; 343/718; 340/571.2, 572.1
See application file for complete search history.

(56) References Cited

U.S. PATENT DOCUMENTS 5,804,882 A  9/1998  Tsukagoshi et al. ........ 257/783
2002/0053735 A1 *  5/2002  Neuhaus et al. ............ 257/728
2002/0115278 A1  8/2002  Kawai ........................ 438/612
2004/0212544 A1  10/2004  Pennaz et al. ............. 343/795
2004/0217153 A1  11/2004  Farroni ..................... 228/248.1

FOREIGN PATENT DOCUMENTS

| EP | 0 977 145 A2 | 2/2000 |
| EP | 1 167 068 A1 | 1/2002 |
| EP | 1167068 A1 * | 1/2002 |
| JP | 2000-311226 | 11/2000 |

* cited by examiner

*Primary Examiner*—Jeffery Hofsass
*Assistant Examiner*—Shirley Lu
(74) *Attorney, Agent, or Firm*—Kratz, Quintos & Hanson, LLP.

(57) ABSTRACT

The present invention provides a radio frequency identification (RFID) tag which exchanges information with an external device in a noncontact manner, in which a paste is used as a material for an antenna, and which is designed to prevent sinking of bumps. A stopper for limiting sinking of bumps of a circuit chip caused by a pressing force when the circuit chip is connected to an antenna is provided on the circuit chip or a base at a position adjacent to the bumps.

2 Claims, 19 Drawing Sheets

RFID TAG AND METHOD OF MANUFACTURING THE SAME

BACKGROUND OF THE INVENTION

1. Field of the Invention

The present invention relates to a radio frequency identification (RFID) tag that exchanges information with an external device in a noncontact manner and a method of manufacturing the same. In some cases, among those skilled in the technical field corresponding to the present invention, the "RFID tag" referred to in this specification is called "RFID tag inlay" as an internal constituent member (inlay) for an "RFID tag". In some other cases, this "RFID tag" is called "wireless IC tag". Also, this "RFID" tag includes a noncontact-type IC card.

2. Description of the Related Art

In recent years, various types of RFID tags capable of noncontact information exchange by means of radio waves with external devices typified by reader/writers have been proposed. One of the various types of RFID tags proposed has an antenna pattern for radio wave communication and an IC chip mounted on a base sheet made of a plastic or paper. A conceivable usage form of such type of RFID tag is that the RFID tag is attached to an article and information about the article is exchanged with an external device for identification or the like of the article.

FIG. 1(A) is a front view and FIG. 1(B) is a sectional side view, respectively, of an example of an RFID tag.

The RFID tag 1 shown in FIGS. 1(A) and 1(B) is constituted by an antenna 12 provided on a base 13 formed of a sheet-like material such as a polyethylene telephthalate (PET) film, an IC chip 11 connected to the antenna 12 through bumps 16, and a cover sheet 14 bonded to the base 13 by an adhesive 15 so as to cover the antenna 12 and the IC chip 11.

The IC chip 11 constituting the RFID tag 1 is capable of exchanging information with an external device by performing wireless communication through the antenna 12.

Various use forms including the above-mentioned use form have been conceived with respect to this type of RFID tag. In use of this type of RFID tag, how to reduce the manufacturing cost of the RFID tag has been a serious problem and various attempts have been made to solve this problem.

As one of the attempts to reduce the manufacturing cost, there is proposed the idea of forming an antenna by using a paste material which is made conductive by blending a metallic filler (Ag in ordinary cases) with a resin material such as an epoxy resin (Japanese Patent Laid-Open No. 2000-311226 (paragraph [0066])). If such a paste material can be used as a material for forming an antenna in place of a thin metallic material such as Cu, Al or Au that is conventionally used, it can largely contribute to a reduction in the manufacturing cost of the RFID tag.

When manufacturing the RFID tag in which, as shown in FIG. 1, the IC chip 11 is connected to the antenna 12 formed on the surface of the base 13 that is a sheet-like PET member or the like through the bumps (metal protrusions) 16 formed on electrodes of the IC chip 11, if the antenna 12 is formed by printing a paste material, a problem described below may arise with the connection between the IC chip 11 and the antenna 12.

FIG. 2(A) shows a case where a metal is used as an antenna material and FIG. 2(B) shows a case where a paste is used as an antenna material for comparison.

An antenna 121 (FIG. 2(A)) formed of a thin sheet of a metal or an antenna 122 formed of a paste material (FIG. 2(B)) is formed on the base 13 formed of a PET. The bumps 16 are formed on electrodes 111 formed on the IC chip 11 in each of the cases shown in FIGS. 2(A) and 2(B).

Each of the states shown in FIGS. 2(A) and 2(B) shows a state in which the IC chip 11 with bumps 16 is placed on the base 13 on which the antenna 121 or 122 is formed such that the bumps 16 face the base 13 and the IC chip 11 is connected to the antenna 121 or 122 through the bumps 16.

In FIGS. 2(A) and 2(B), illustration of the adhesive 15 and the cover sheet 14 shown in FIG. 1(B) is omitted. At the time of connection, the IC chip 11 is pressed from above as viewed in the figure with a jig (not shown). A pressing force is thereby applied from the bumps 16 to the antenna 121 or 122. In the case of the antenna 121 made of a metallic material as shown in FIG. 2(A), there is no problem with this pressing, since the hardness of the antenna 121 is high. In the case of the antenna 122 made of a paste material as shown in FIG. 2(B), there is a problem described below. The paste material deforms by the pressing force received by the antenna 122 from the bumps 16 so as to conform to the shape of the bumps 16, and compression bending of the paste material is thereby caused at the connection between the antenna 122 and the bumps 16, resulting in pattern breakage and sinking at the bent portion. In this case, the necessary insulation distance cannot be maintained between the IC chip 11 and the antenna 122. If this distance is changed, characteristics of the RFID tag including a wireless communication characteristic (hereinafter referred to as tag characteristics) are changed, which results in variations in tag characteristics when a large number of RFID tags are manufactured.

The method of mounting various types of IC chips on a circuit board apart from the RFID tag is being widely practiced. In ordinary cases, many bumps are formed on an IC chip and the pressing force per bump is small even when a paste material is used as a wiring material on a circuit board and, therefore, protrusion of the paste material is not a serious problem.

In contrast, in the case of the RFID tag, since the number of bumps provided in one IC chip for connection to the antenna is about two or four, the pressing force per bump is extremely large and thus the above-mentioned sinking problem arises. In order to reduce the pressing force, it is necessary to reduce the pressing force, which is applied by an apparatus for placing the IC chip on the base when placing the IC chip, to an extremely small value in comparison with the case of placing an ordinary IC chip on which many bumps are formed. Also, since an adhesive exists between the base and the IC chip, it is extremely difficult to reduce the pressing force to an extremely small value while enabling a reliable connection to be made in a short time.

SUMMARY OF THE INVENTION

The present invention has been made in view of the above circumstances and provides an RFID tag using a paste as a material for an antenna and capable of avoiding the problem that the tag characteristics are changed by sinking of bumps, and a method of manufacturing the RFID tag.

According to the present invention, there is provided a first RFID tag having: a base; an antenna for communication provided on the base; a circuit chip connected to the antenna through bumps, the circuit chip performing wireless communication through the antenna, wherein the antenna is formed of a paste in which a metallic filler is blended with a resin material; and a stopper for limiting sinking of the bumps caused by a pressing force when the circuit chip with the bumps is connected to the antenna is provided adjacent to the bumps.

In the first RFID tag of the present invention, the stopper is provided to limit sinking described above with reference to FIG. 2(B), thereby avoiding the problem due to variations in tag characteristics.

In the first RFID tag of the present invention, the stopper may be formed of a film formed on the circuit chip or the base and having holes in correspondence with the portions to which the bumps are connected. The stopper may alternatively be formed of a protrusion formed on a portion of the base adjacent to the portions to which the bumps are connected.

Further, in the first RFID tag of the present invention, a gap between the base and the circuit chip may be filled with an adhesive in which a filler is blended to fix the circuit chip and the base to each other when the circuit chip with the bumps is connected to the antenna, and the filler may constitute the stopper.

According to the present invention, there is provided a second RFID tag having: a base; an antenna for communication provided on the base; a circuit chip connected to the antenna through bumps, the circuit chip performing wireless communication through the antenna, wherein the antenna is formed of a paste in which a metallic filler is blended with a resin material; and a hard layer for limiting sinking of the bumps caused by a pressing force when the circuit chip with the bumps is connected to the antenna is provided at least at positions right below the bumps between the base and the antenna.

In the second RFID tag of the present invention, the hard layer is provided to limit sinking described above with reference to FIG. 2(B), thereby avoiding the problem due to variations in tag characteristics.

According to the present invention, there is provided a third RFID tag having: a base; an antenna for communication provided on the base; a circuit chip connected to the antenna through bumps, the circuit chip performing wireless communication through the antenna, wherein the antenna is formed of a paste in which a metallic filler is blended with a resin material; and an electroconductive support for limiting sinking of the bumps caused by a pressing force when the circuit chip with the bumps is connected to the antenna is provided between the antenna and the bumps.

In the third RFID tag of the present invention, the support is provided to limit sinking of the bumps, as in the case of the RFID tags in the first and second aspects of the present invention. Therefore the tag characteristics of the RFID tag can be stabilized.

According to the present invention, there is provided a fourth RFID tag having: a base; an antenna for communication provided on the base; and a circuit chip connected to the antenna through bumps, the circuit chip performing wireless communication through the antenna, wherein the antenna is formed of a paste in which a metallic filler is blended with a resin material, and portions of the antenna right below the bumps are formed of a paste in which the ratio of blending of the metallic filler is changed in comparison with that in the paste for the portion other than the portions right below the bumps to limit sinking of the bumps caused by a pressing force when the circuit chip with the bumps is connected to the antenna.

In the fourth RFID tag of the present invention, the ratio of blending of the metallic filler for the portions of the antenna immediately below the bumps is changed to limit sinking, thereby stabilizing the tag characteristics of the RFID tag as well as those of the RFID tags in the first to third aspects.

According to the present invention, there is provided a fifth RFID tag having: a base; an antenna for communication provided on the base; and a circuit chip connected to the antenna through bumps, the circuit chip performing wireless communication through the antenna, wherein the antenna is formed of a paste in which a metallic filler for giving the necessary conductivity for the antenna to a resin material is blended with the resin material, and a hard filler for limiting sinking of the bumps caused by a pressing force when the circuit chip with the bumps is connected to the antenna is also blended with the resin material.

In the fifth RFID tag of the present invention, the antenna constituting the RFID tag is formed of a paste in which the hard filler (e.g., Cu, Pd, Ni or the like) as well as the metallic filler (e.g., Ag) are blended, thereby limiting sinking and stabilizing the tag characteristics.

According to the present invention, there is provided a first method of manufacturing an RFID tag, including: an antenna printing step of printing an antenna for communication on a base by using a paste in which a metallic filler is blended with a resin material; a circuit chip mounting step of mounting a circuit chip with bumps capable of performing wireless communication through the antenna, the circuit chip and the antenna being connected to each other through the bumps; and a stopper forming step of forming at a position adjacent to the bumps a stopper for limiting sinking of the bumps caused by a pressing force when the circuit chip with the bumps is connected to the antenna.

According to the present invention, there is provided a second method of manufacturing an RFID tag, including: an antenna printing step of printing an antenna for communication on a base by using a paste in which a metallic filler is blended with a resin material; a circuit chip mounting step of mounting a circuit chip with bumps capable of performing wireless communication through the antenna, the circuit chip and the antenna being connected to each other through the bumps; and a hard layer forming step of forming, at least at positions right below the bumps, between the base and the antenna a hard layer for limiting sinking of the bumps caused by a pressing force when the circuit chip with the bumps is connected to the antenna.

According to the present invention, there is provided a third method of manufacturing an RFID tag, including: an antenna printing step of printing an antenna for communication on a base by using a paste in which a metallic filler is blended with a resin material; a circuit chip mounting step of mounting a circuit chip with bumps capable of performing wireless communication through the antenna, the circuit chip and the antenna being connected to each other through the bumps; and a support forming step of forming between the antenna and the bumps an electroconductive support for limiting sinking of the bumps caused by a pressing force when the circuit chip with the bumps is connected to the antenna.

According to the present invention, there is provided a fourth method of manufacturing an RFID tag, including: an antenna printing step of printing an antenna for communication on a base by using a paste in which a metallic filler is blended with a resin material; and a circuit chip mounting step of mounting a circuit chip with bumps capable of performing wireless communication through the antenna, the circuit chip and the antenna being connected to each other through the bumps, wherein the antenna printing step includes a first printing step of printing a portion of the antenna other than the portions to which the bumps are connected by using the paste in which the metallic filler is blended with the resin material, and a second printing step of printing the portions of the antenna to which the bumps are connected by using a paste in which the ratio of blending of the metallic filler is changed in comparison with that in the paste used in the first printing step so as to form on the portions of the antenna to which the bumps are connected a hard electroconductive film for limiting sinking of the bumps caused by a pressing force when the circuit chip with the bumps is connected to the antenna.

According to the present invention, there is provided a fifth method of manufacturing an RFID tag, including: an antenna printing step of printing an antenna for communication on a base by using a paste in which a metallic filler is blended with a resin material; and a circuit chip mounting step of mounting a circuit chip with bumps capable of performing wireless communication through the antenna, the circuit chip and the antenna being connected to each other through the bumps, wherein the antenna printing step is a step of printing the antenna for communication on the base by using a paste in which a metallic filler for giving the necessary conductivity for the antenna to the resin material is blended with the resin material, and a hard filler for limiting sinking of the bumps caused by a pressing force when the circuit chip with the bumps is connected to the antenna is also blended with the resin material.

According to the present invention, as described above, a paste is used as the material of the antenna and sinking of the bumps of the circuit chip caused by a pressing force applied through the bumps is limited to stabilize the tag characteristics.

DETAILED DESCRIPTION OF THE INVENTION

The present invention will be described below with respect to embodiments thereof.

Figure 3:
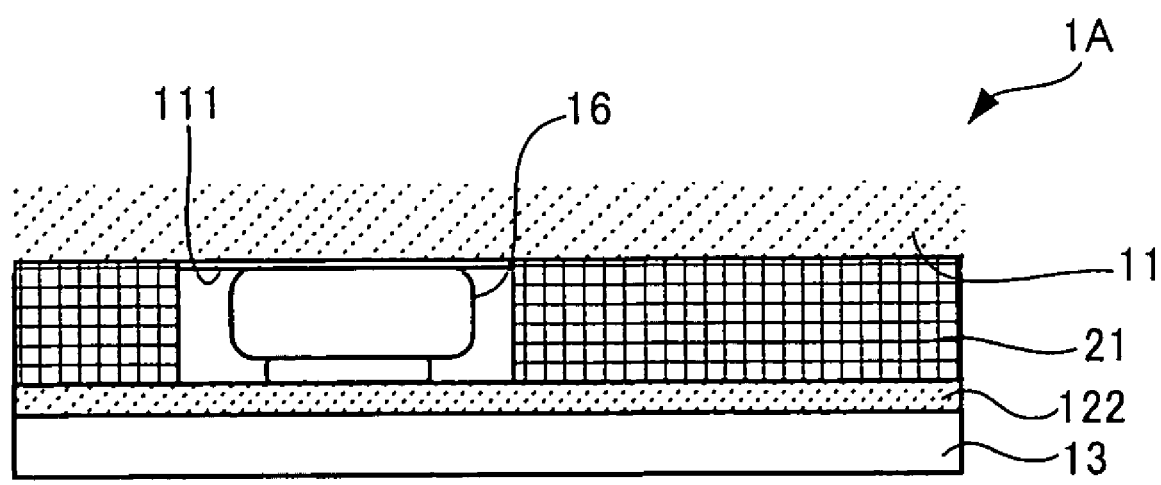
FIG. 3 is a sectional view of an RFID tag according to a first embodiment of the present invention.

FIG. 3 is a sectional view of an RFID tag according to the first embodiment of the present invention.

Figure 1A:
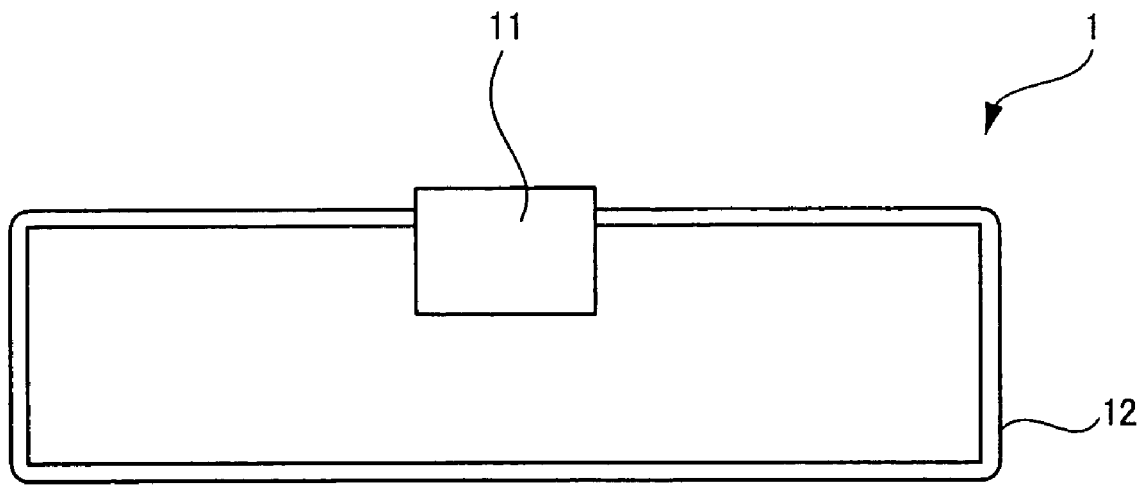
FIGS. 1(A) and 1(B) are a front view and a sectional side view respectively of an example of an RFID tag.
Figure 1B:
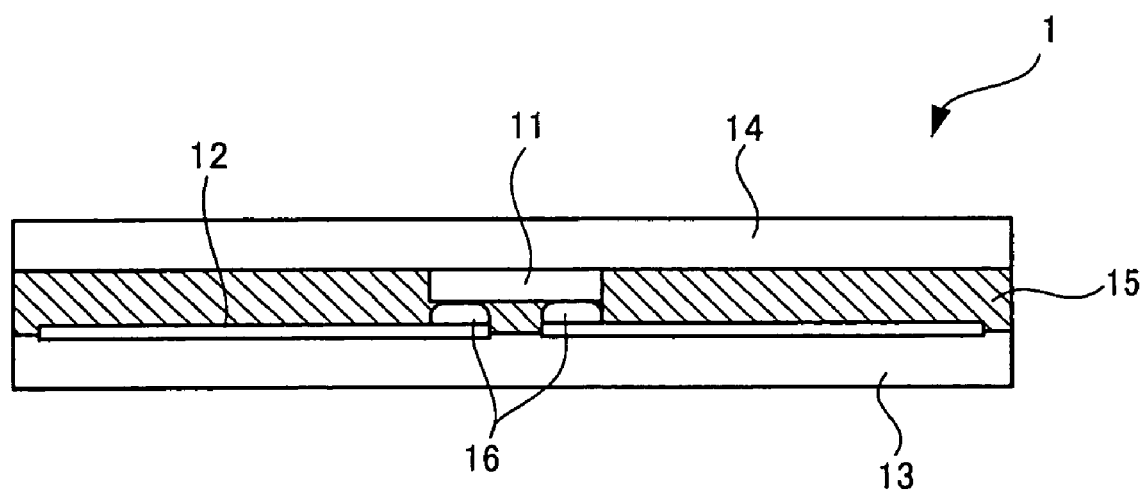
Figure 2:
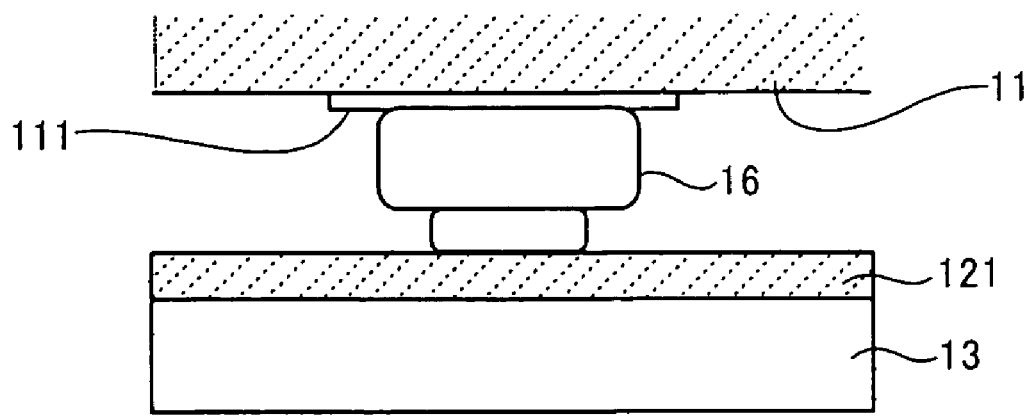
FIGS. 2(A) and 2(B) are diagrams respectively showing the case of using a metal as an antenna material and the case of using a paste as an antenna material for comparison.
Figure 2:
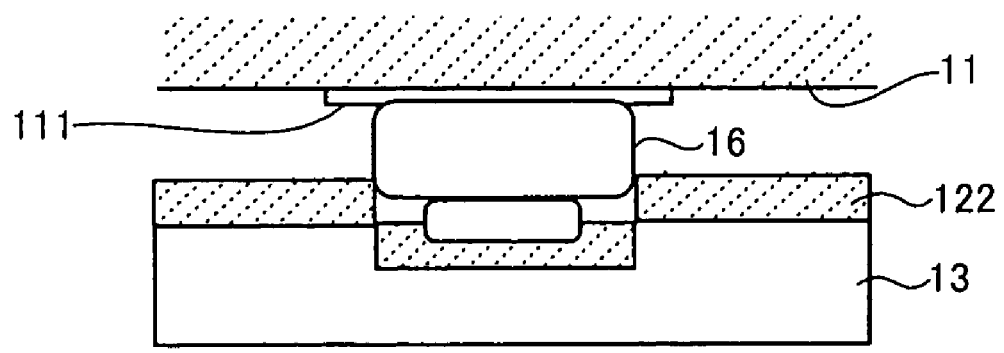

In FIG. 3 and other figures referred to below, constituents corresponding to those of the RFID tag described above with reference to FIG. 2 are indicated by the same reference numerals and the description for them will not be repeated. Description will be made only of points different from the above-described RFID tag. In FIG. 3 and the other figures referred to below, illustration of the adhesive 15 between the base 13 and the IC chip 11 and the base sheet 14 (see FIG. 2(B)) that covers upper portions of the RFID tag is omitted in principle, as is that in FIG. 2. However, a feature of the present invention described below with reference to FIG. 20 resides in an adhesive. Therefore, the adhesive is shown in FIG. 20. Also, in the embodiments described below, the base 13 is formed of a PET and the antenna 122 is formed by using a paste prepared by blending an Ag filler with a resin material such as an epoxy resin unless otherwise specified.

In the RFID tag 1A shown in FIG. 3, a polyimide film 21 having holes at positions corresponding to bumps is formed on the IC chip 11. The polyimide film 21 is slightly lower than the height of bumps 16 (thinner than bumps 16). When the IC chip 11 with bumps 16 and polyimide film 21 is connected to the antenna 122, the polyimide film 21 functions as a stopper to limit sinking of the bumps 16 (see FIG. 2(B)), thus stabilizing the tag characteristics of the RFID tag.

Figure 4:
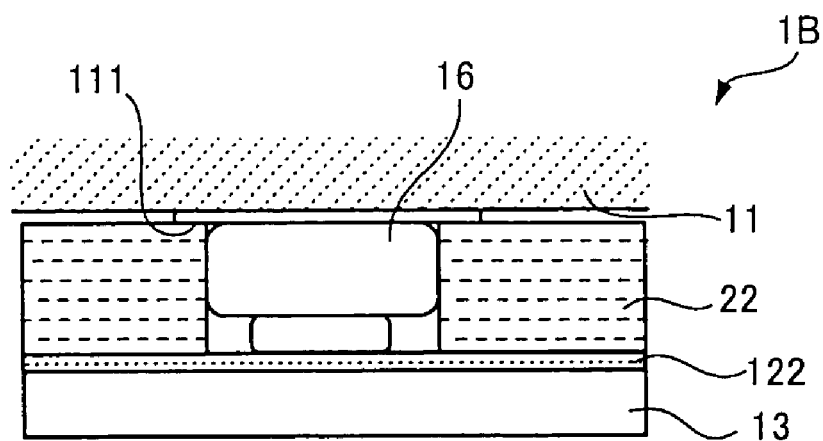
FIG. 4 is a sectional view of an RFID tag according to a second embodiment of the present invention.

FIG. 4 is a sectional view of an RFID tag according to a second embodiment of the present invention.

In the RFID tag 1B shown in FIG. 4, a PET member 22 having holes is adhered to the base 13. The thickness of the PET member 22 is slightly smaller than the height of the bumps 16. When the IC chip 11 with the bumps 16 is connected to the antenna 122, the PET member 22 functions as a stopper to limit sinking of the bumps 16, thus stabilizing the tag characteristics of the RFID tag.

Figure 5:
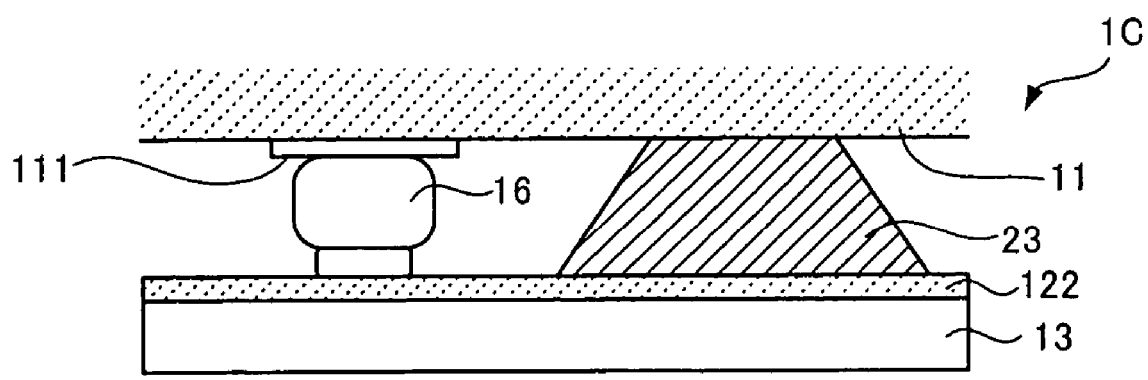
FIG. 5 is a sectional view of an RFID tag according to a third embodiment of the present invention.

FIG. 5 is a sectional view of an RFID tag according to a third embodiment of the present invention.

In the RFID tag IC shown in FIG. 5, a protrusion (stopper portion 23) slightly lower in height than the bumps 16 is formed on the base 13 side before the IC chip 11 is connected to the antenna 122. When the IC chip 11 with the bumps 16 is connected to the antenna 122, sinking of the bumps 16 is limited by the function of the stopper portion 23.

Figure 6:
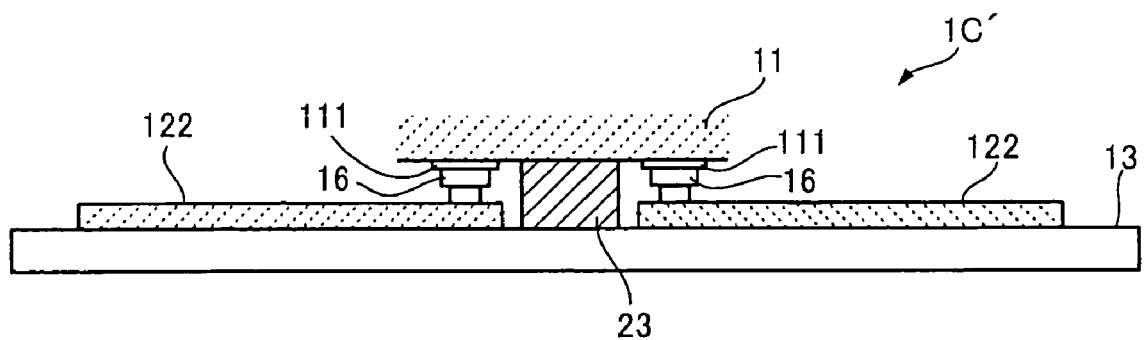
FIGS. 6(A) to 6(C) show an RFID tag which is an example of a modification of the third embodiment of the present invention.
Figure 6:
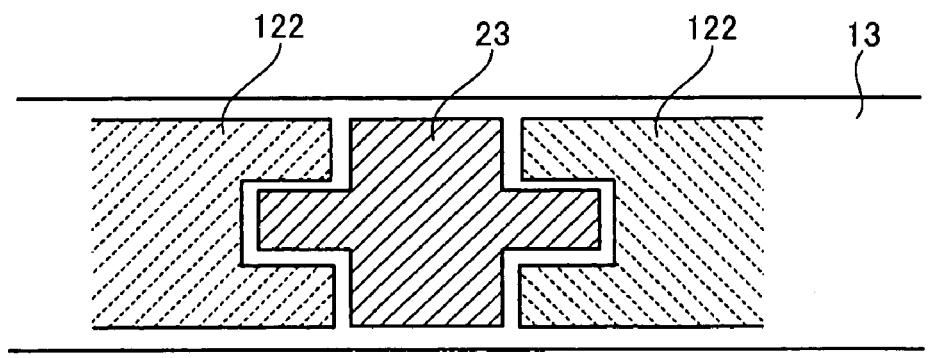
Figure 6:
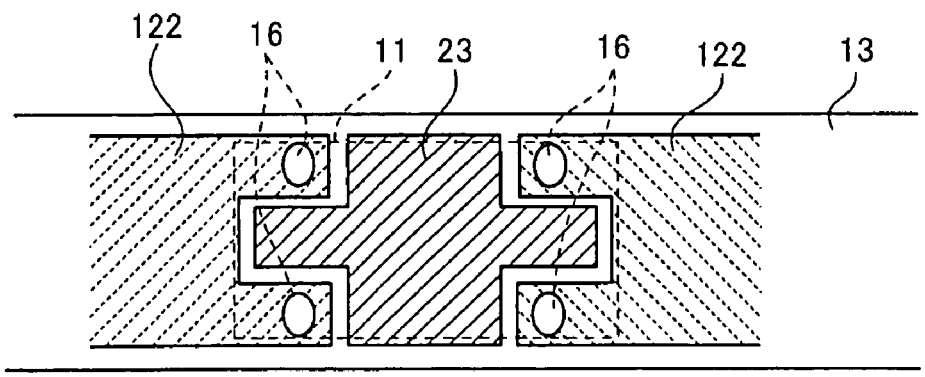

FIGS. 6(A) to 6(C) show an RFID tag as an example of a modification of the third embodiment of the present invention (See FIG. 5). FIG. 6(A) is a sectional view, FIG. 6(B) is a plan view showing the base before the IC chip is mounted, and FIG. 6(C) is a plan view showing the base after mounting the IC chip. In FIG. 6(C), the position of the IC chip is indicated only by the broken line.

Also in the RFID tag 1C' shown in FIGS. 6(A) to 6(C), a protrusion (stopper portion 23) slightly lower in height than the bumps 16 is formed on the base 13 side before the IC chip 11 is connected to the antenna 122, as is that in the case shown in FIG. 5. When the IC chip 11 with the bumps 16 is connected to the antenna 122, sinking of the bumps 16 is limited by the function of the stopper portion 23. In the case of the RFID tag 1C' shown in FIGS. 6(A) to 6(C), the stopper portion 23 is formed on the portion of the base 13 on which the IC chip 11 is mounted except the portions on which connections to the bumps 16 are made. That is, the stopper portion 23 extends so as to fill the almost entire region where no antenna portion exists between two ends of the antenna 122. If the stopper portion 23 conforms to the region where no antenna pattern portion exists, it is possible to maintain the balance (attitude) of the IC chip 11 at the time of mounting of the IC chip 11 on the base 13 as well as to improve the intimate contact between the IC chip 11 and the base 13.

Figure 7:
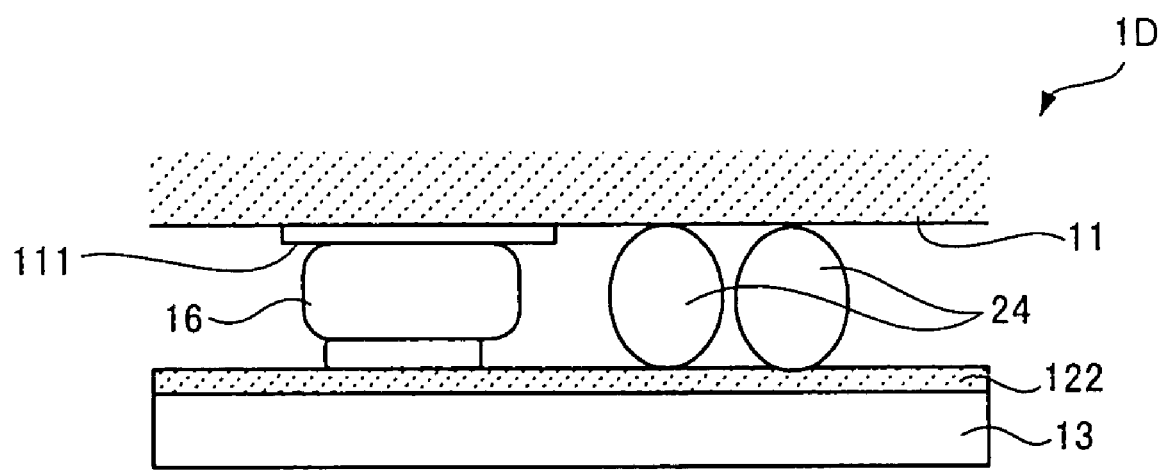
FIG. 7 is a sectional view of an RFID tag according to a fourth embodiment of the present invention.

FIG. 7 is a sectional view of an RFID tag according to a fourth embodiment of the present invention.

In the RFID tag 1D shown in FIG. 7, a plastic filler 24 having a diameter slightly smaller than the height of the bumps 16 is blended with an adhesive (not shown). When the IC chip 11 with the bumps 16 is connected to the antenna 122, the plastic filler 24 functions as a stopper to limit sinking of the bumps 16.

Figure 8:
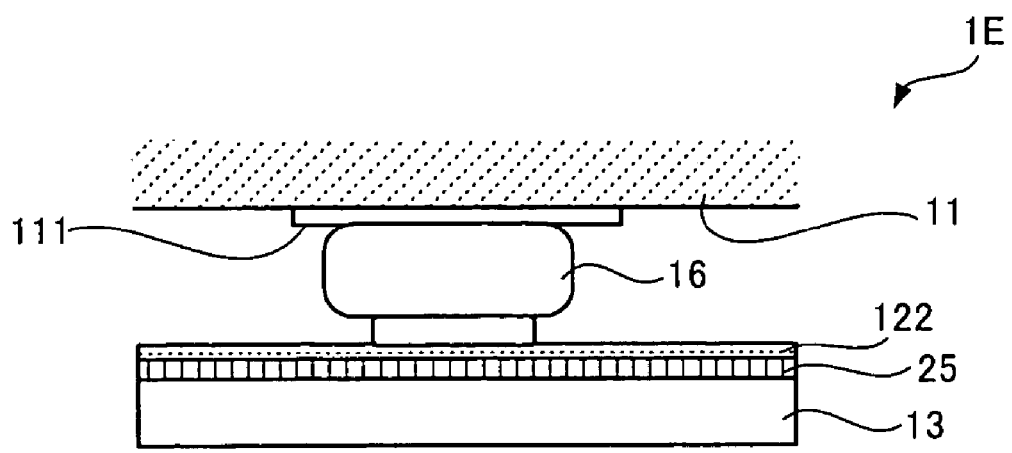
FIG. 8 is a sectional view of an RFID tag according to a fifth embodiment of the present invention.

FIG. 8 is a sectional view of an RFID tag according to a fifth embodiment of the present invention.

In the RFID tag 1E shown in FIG. 8, a hard resin layer 25 is provided between the base 13 formed of a PET and the antenna 122. When the IC chip 11 with the bumps 16 is connected to the antenna 122, sinking of the bumps 16 is limited thanks to the existence of the hard resin layer 25.

Figure 9:
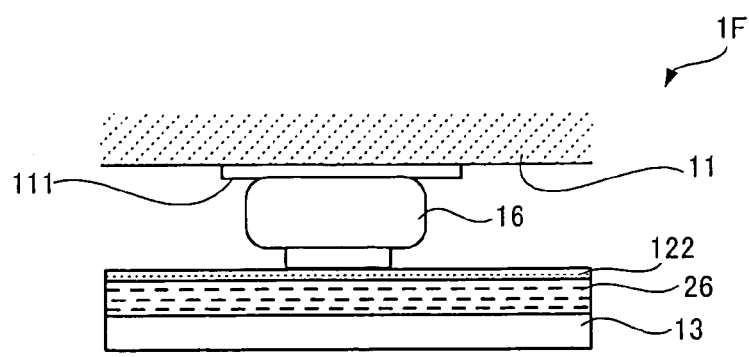
FIG. 9 is a sectional view of an RFID tag according to a sixth embodiment of the present invention.

FIG. 9 is a sectional view of an RFID tag according to a sixth embodiment of the present invention.

In the RFID tag 1F shown in FIG. 9, a PET sheet 26 harder than the base 13 is placed between the base 13 formed of a PET and the antenna 122. When the IC chip 11 with the bumps 16 is connected to the antenna 122, sinking of the bumps 16 is limited thanks to the existence of the hard PET sheet 26, as in the case of the RFID tag 1E shown in FIG. 8.

Figure 10:
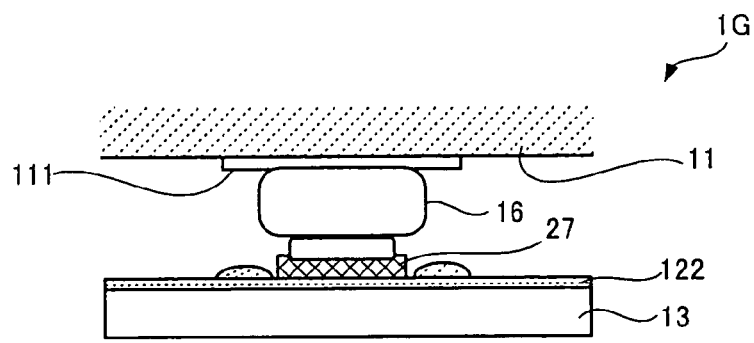
FIG. 10 is a sectional view of an RFID tag according to a seventh embodiment of the present invention.

FIG. 10 is a sectional view of an RFID tag according to a seventh embodiment of the present invention.

In the RFID tag 1G shown in FIG. 10, supports 27 made of a metal are disposed on the portions of the antenna 122 on the base 13 which correspond to the positions of the bumps 16. The bumps 16 are directly connected to the supports 27 and connected to the antenna 122 through the supports 27. In the case of this RFID tag 1G, sinking of the bumps 16 is prevented thanks to the existence of the supports 27.

Figure 11:
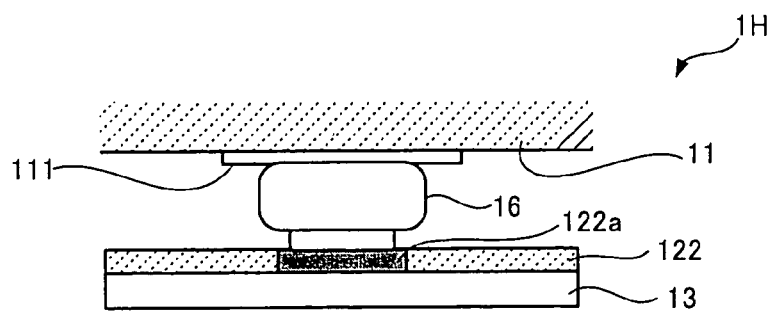
FIG. 11 is a sectional view of an RFID tag according to an eighth embodiment of the present invention.

FIG. 11 is a sectional view of an RFID tag according to an eighth embodiment of the present invention.

In the RFID tag 1H shown in FIG. 11, the Ag filler filling factor of bump mount portions 122a of the antenna 122 to be connected to the bumps 16 is increased relative to that of the portion other than the bump mount portions 122a so that the bump mount portions 122a are higher in hardness than the other portion, thereby limiting sinking of the bumps 16 when the antenna 122 receives the pressing force from the bumps 16.

Figure 12:
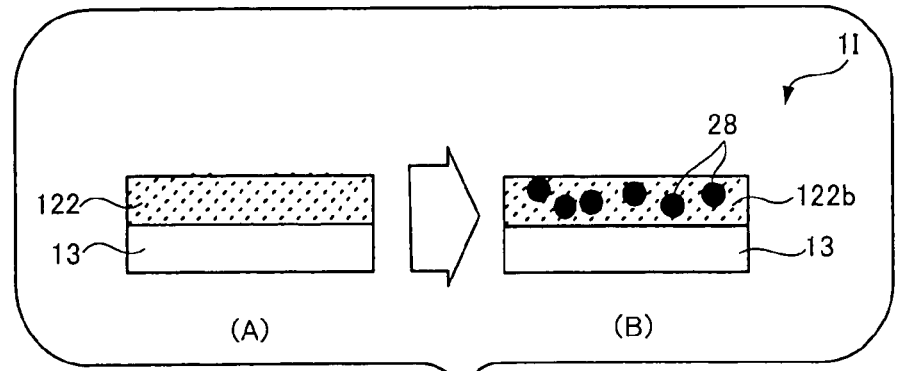
FIG. 12 is a sectional view of base and antenna portions of an RFID tag according to a ninth embodiment of the present invention.

FIG. 12 is a sectional view of base and antenna portions of an RFID tag according to a ninth embodiment of the present invention.

Any fault due to the above-described sinking has not been considered in the conventional techniques. Thus, typically, when adopting a paste as the material of the antenna 122, blending of a filler with the paste, e.g., blending of an Ag filler or the like with a resin material such as an epoxy resin shown in Part (A) of FIG. 12, has been performed mainly for the purpose of giving the necessary conductivity to the paste so that the paste functions as the antenna.

In contrast, in the case of the RFID tag 1I having the base and the antenna shown in Part (B) of FIG. 12, a filler such as an Ag filler for giving the necessary conductivity to the paste so that the paste functions as the antenna is blended with a resin material such as an epoxy resin, and a filler 28 for giving the necessary hardness to the antenna formed of the paste, e.g., Cu, Pd or Ni is also blended with the resin material. An antenna 122b is formed by using the paste in which such fillers are blended. In this way, sinking of the bumps 16 caused by the pressing force from the bumps 16 is prevented.

Methods of manufacturing the various RFID tags 1A to 1I described above will now be described.

FIGS. 13(A) to 13(C) illustrate a method of forming the bumps on the electrodes of the IC chip.

First, a thin metal wire 30 to be formed as bumps is caused to project from the tip of a jig 20 with a hole, as shown in FIG. 13(A), and electric discharge is caused between the thin metal wire 30 and a discharge electrode 40. A portion of the thin metal wire 30 at the tip is molten by the discharge energy to form a metal ball 31.

Subsequently, the metal ball 31 is pressed against the electrode 111 of the IC chip 11 and ultrasonic waves are applied to the metal ball 31 through the jig 20, as shown in FIG. 13(B). The metal ball 31 is joined to the electrode 111 of the IC chip 11 by the ultrasonic waves. When the jig 20 is removed, the metal ball 31 and the thin metal wire 30 at the foot are torn off to form the bump in original form 32 on the electrode 111 of the IC chip 11, as shown in FIG. 13(C).

Figure 14:
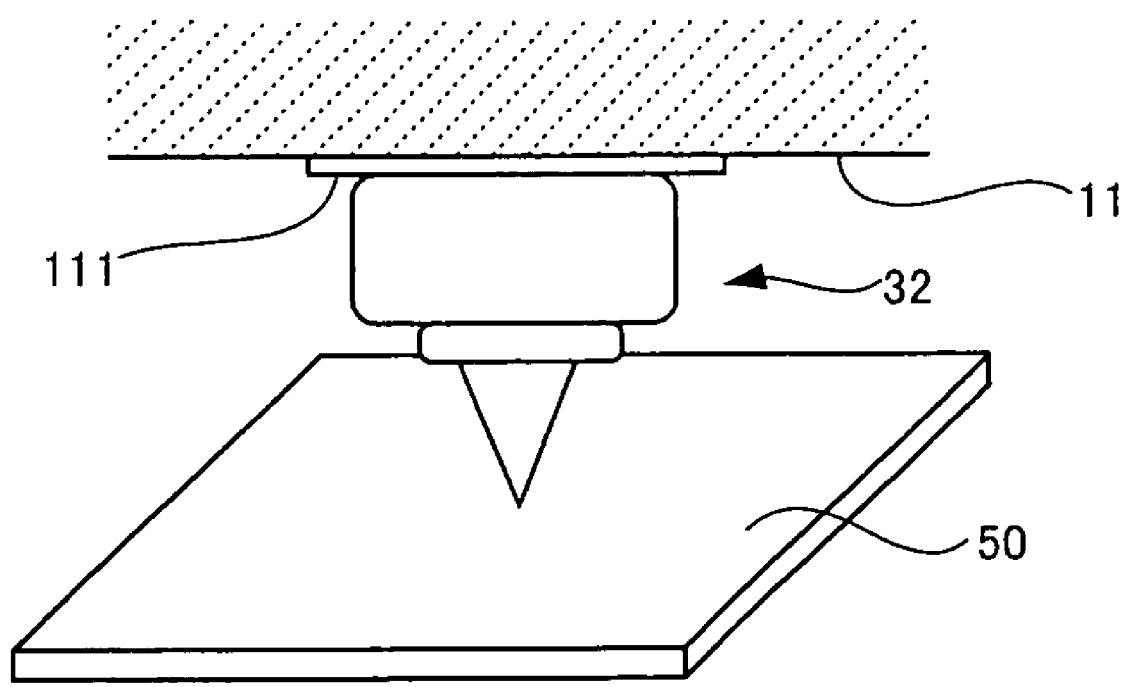
FIG. 14 is a diagram showing a method of leveling bumps.
Figure 15A:
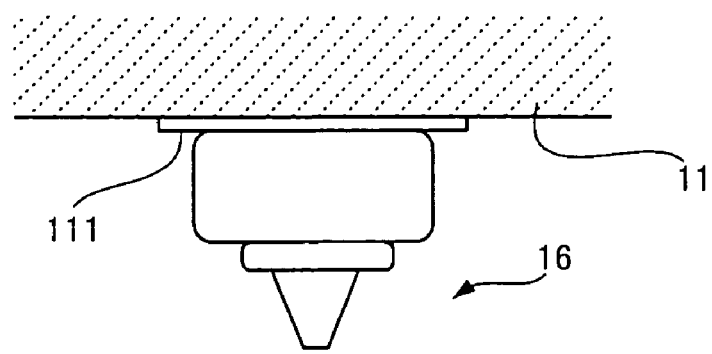
FIGS. 15(A) to 15(C) show the bump after leveling.
Figure 15B:
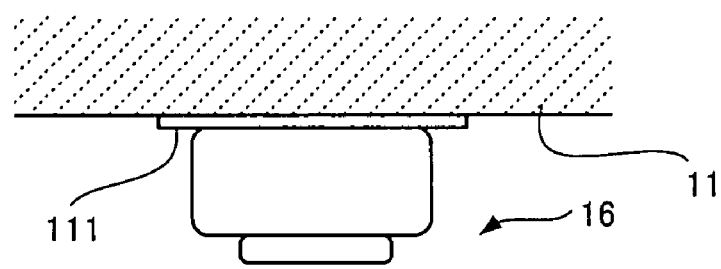
Figure 15C:
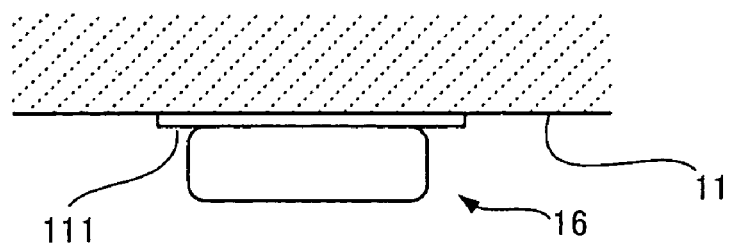

FIG. 14 is a diagram showing a method of leveling the bump, and FIGS. 15(A) to 15(C) are diagrams showing the bump after leveling.

Figure 13:
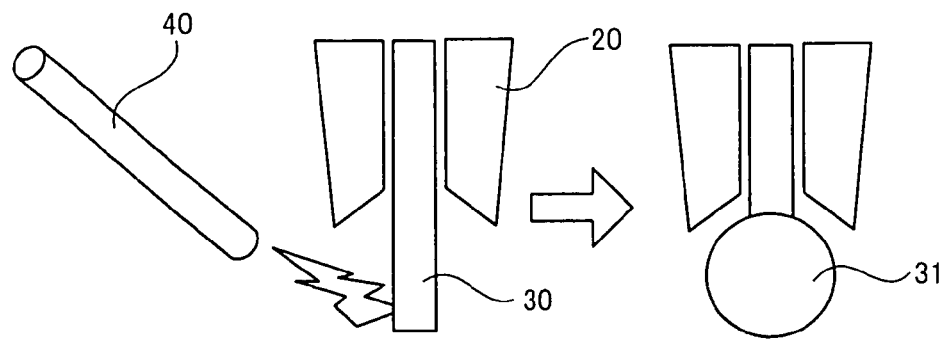
FIGS. 13(A) to 13(C) show a method of forming bumps on electrodes of an IC chip.
Figure 13:
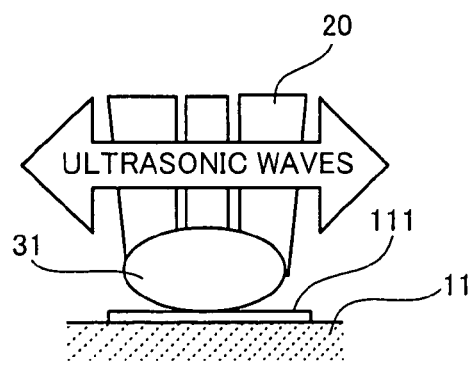
Figure 13:
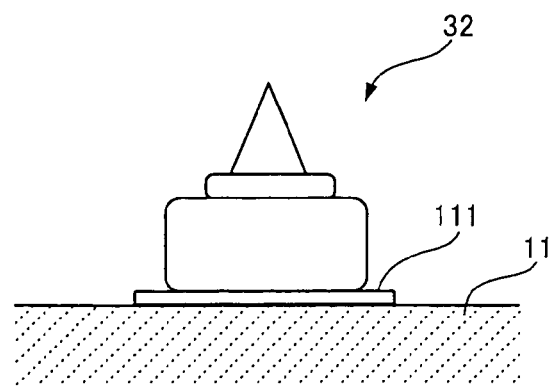

After being formed on the electrode 111 of the IC chip 11 as shown in FIG. 13, the bump in original form 32 is pressed on a flat surface of a glass plate 50, as shown in FIG. 14. The load for this pressing and the pressing height are selected to change the shape of the bump. That is, the bump 16 having the shape shown in FIG. 15(A) is formed in the case of low-load high-position pressing; the bump 16 having the shape shown in FIG. 15(B) is formed in the case of medium-load medium-position pressing; and the bump 16 having the shape shown in FIG. 15(C) is formed in the case of high-load low-position pressing.

FIGS. 16(A) to 16(D) show a method of manufacturing the RFID tag having the stopper formed of the polyimide film with holes shown in FIG. 3.

The polyimide film 21 is formed on the surface of the IC chip 11 on which the electrodes 111 are provided (FIG.

Figure 16:
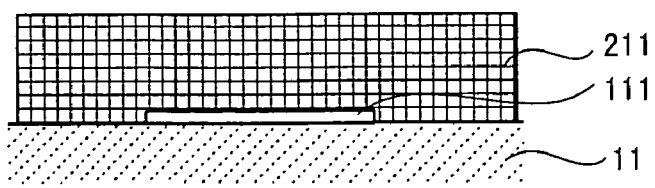
FIGS. 16(A) to 16(D) show a method of manufacturing the RFID tag having the stopper formed of polyimide film with holes as shown in FIG. 3.
Figure 16:
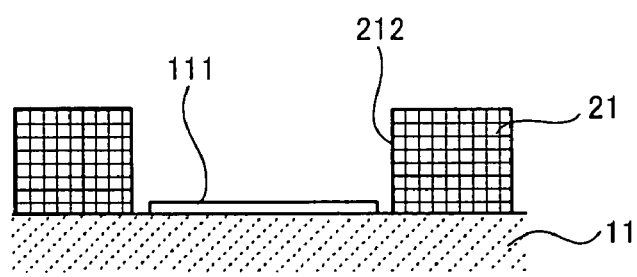
Figure 16:
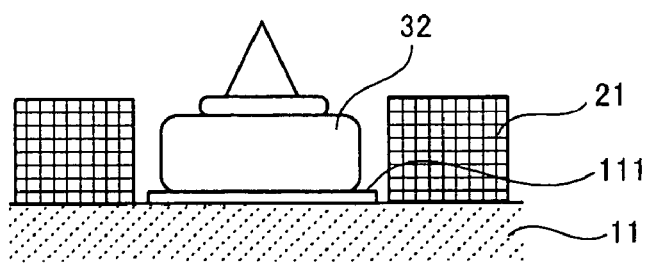
Figure 16:
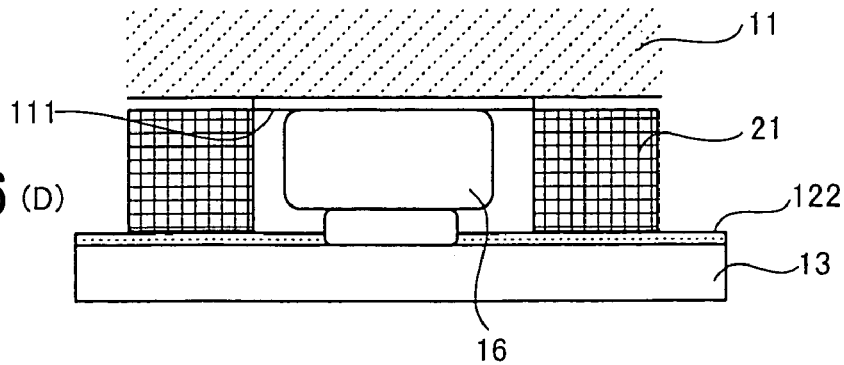

16(A)), and only portions of the polyimide film 21 corresponding to the electrodes 111 are removed by laser machining or etching, thereby forming the polyimide film 21 having holes 212 formed in correspondence with the electrodes 111 on which bumps will be formed (FIG. 16(B)). Thereafter, the bumps in original form 32 are formed on the electrodes 111 by the method shown in FIGS. 13(A) to 13(C), as shown in FIG. 16(C). Leveling is performed on the bumps in original form 32 by the method shown in FIG. 14 and FIGS. 15(A) to 15(C) to form the bumps 16 slightly higher in height than polyimide film 21. The bumps 16 facing the base 13 and the antenna 122 are connected to each other (FIG. 16(D)). At this time, the polyimide film 21 functions as a stopper to limit sinking of the bumps 16.

Figure 17:
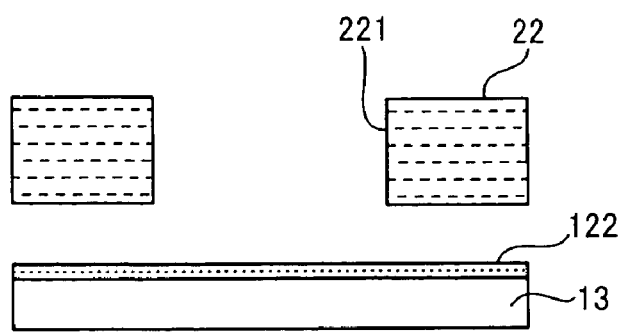
FIGS. 17(A) to 17(C) show a method of manufacturing the RFID tag having a stopper formed of a PET with holes as shown in FIG. 4.
Figure 17:
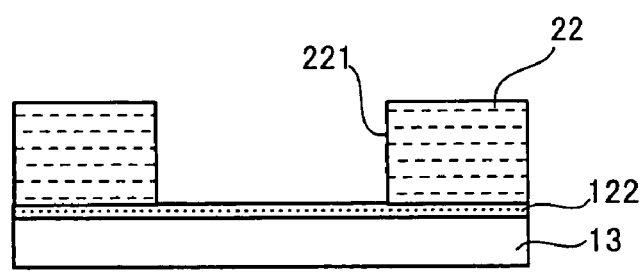
Figure 17:
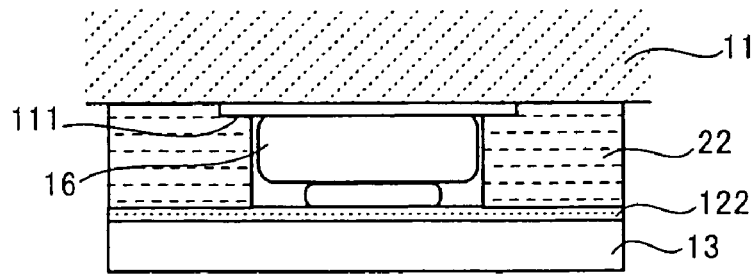

FIGS. 17(A) to 17(C) show a method of manufacturing the RFID tag having the stopper formed of a PET with holes as shown in FIG. 4.

The PET member 22 with holes 221 is prepared (FIG. 17(A)), and is applied to the base 13 on which the antenna 122 is formed, the holes 221 being aligned with the bump connection portions (FIG. 17(B)). The IC chip 11 is thereafter mounted (FIG. 17(C)). At this time, the PET member 22 functions as a stopper to prevent sinking of bumps 16.

Figure 18A:
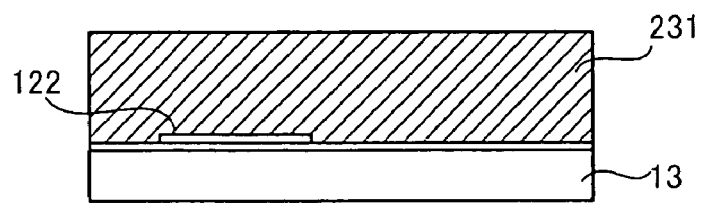
FIGS. 18(A) to 18(C) show a method of manufacturing the RFID tag having a stopper as shown in FIG. 5.
Figure 18B:
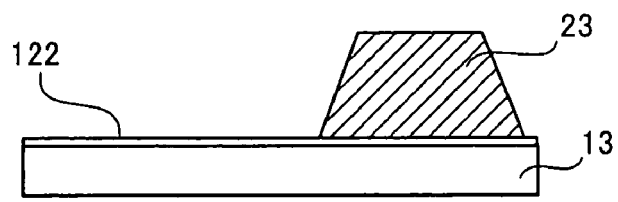
Figure 18C:
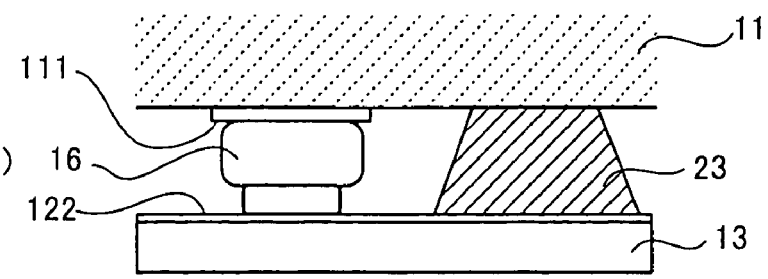

FIGS. 18(A) to 18(C) show a method of manufacturing the RFID tag having the stopper shown in FIG. 5.

A film 231 made of an insulating material is formed on the surface of the base 13 on which the antenna 122 is formed (FIG. 18(A)). As the material of this film 231, polyethylene, epoxy, polyester or the like for example can be used. The film 231 thereby formed has a thickness slightly smaller than the height of bumps 16 formed afterward. Unnecessary portions of the film 231 are removed by chemical etching and only a portion of the film 231 adjacent to the portions of the antenna 122 to be connected to the bumps are left, thereby forming the stopper portion 23 on the base 13 (FIG. 18(B)). The IC chip 11 with bumps 16 is mounted on the base 13 and the bumps 16 and the antenna 122 are connected to each other. Since the stopper portion 23 is formed so as to be slightly lower in height than the bumps 16 before connection, the bumps 16 are connected to the antenna 122 with reliability, and sinking of the bumps 16 is prevented by the function of the stopper portion 23.

While the method of manufacturing the RFID tag according to the third embodiment shown in FIG. 5 has been described with reference to FIGS. 18(A) to 18(C), the RFID tag shown in FIGS. 6(A) to 6(C) as an example of modification of the third embodiment can also be manufactured by forming the stopper portion 23 whose shape however is the one shown in FIG. 6(B).

Figure 19:
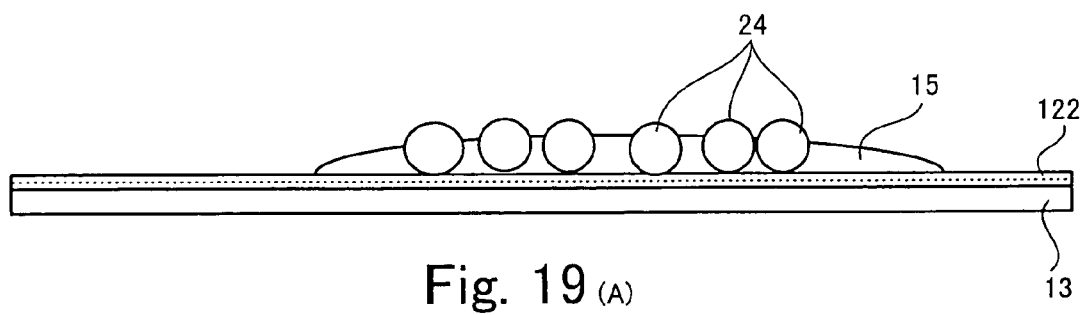
FIGS. 19(A) and 19(B) show a method of manufacturing the RFID tag including a plastic filler shown in FIG. 7.
Figure 19:
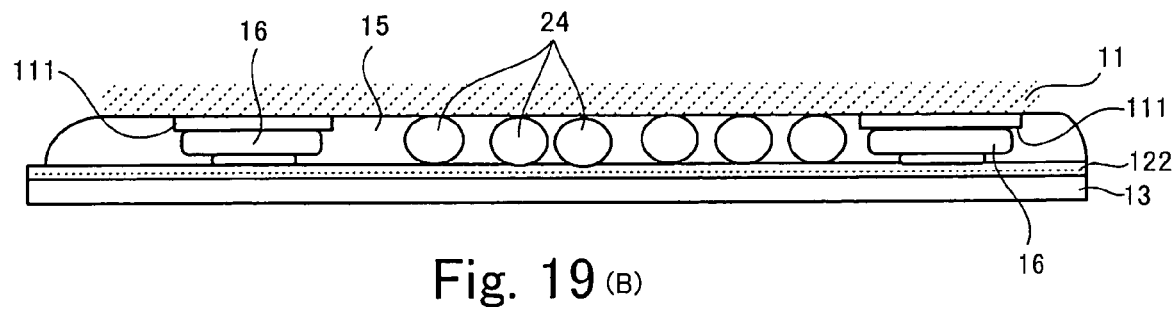

FIGS. 19(A) and 19(B) show a method of manufacturing the RFID tag including the plastic filler shown in FIG. 7.

As shown in FIG. 19(A), the adhesive 15 in which the plastic filler 24 is blended is applied to a portion of the base 13 on which the antenna 122 is formed. The portion of the base 13 to which the plastic filler 24 is applied is adjacent to the portions to be connected to the bumps and is defined at such a position that the filler does not spread to the portions to be connected to the bumps. This application is performed by supplying the adhesive containing the plastic filler 24 from a nozzle tip onto the base 13.

Thereafter, the IC chip 11 with bumps 16 is mounted on the base 13 and the bumps 16 and the antenna 122 are connected to each other, as shown in FIG. 19(B). At this time, however, since the plastic filler 24 has a diameter slightly smaller than the height of the bumps 16, the bumps 16 are connected to the antenna 122 with reliability, and the plastic filler 24 functions as a stopper to prevent sinking of the bumps 16.

FIGS. 20(A) to 20(D) show a method of manufacturing the RFID tag shown in FIG. 8.

Figure 20A:
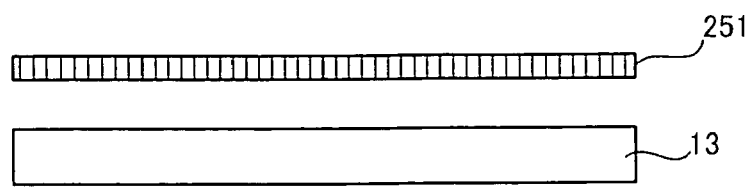
FIGS. 20(A) to 20(D) show a method of manufacturing the RFID tag shown in FIG. 8.
Figure 20B:
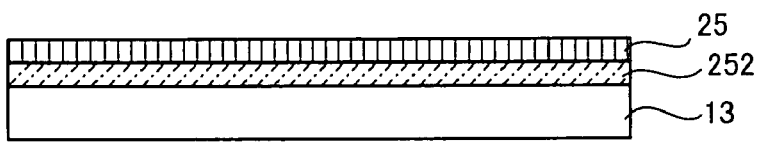

In this case, a hard resin sheet 251 is prepared (FIG. 20(A)) and a hard resin layer 25 is formed by adhering the hard resin sheet 251 to the base 13 by an adhesive 252 (FIG. 20(B)).

Figure 20C:
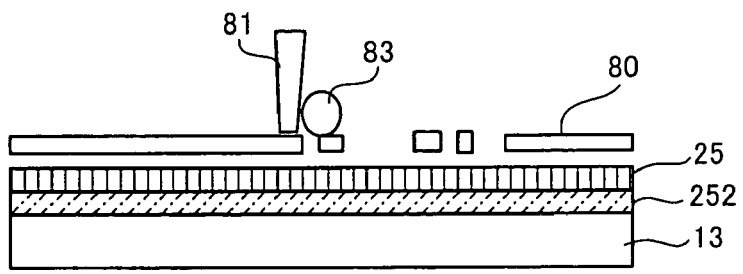

Thereafter, a printing master 80 in which a hole is formed as a pattern for the antenna 122 is placed on the hard resin sheet 251, and a paste 83 provided as the material of the antenna 122 is printed by being forced into the hole of the printing master 80 with a squeegee 81 (FIG. 20(C)).

Thereafter, the printing master 80 for forming the protrusion is removed, followed by drying. The antenna 122 is thereby formed.

As the printing master 80, a thin Al or SUS plate or the like having holes formed at desired positions by etching can be used.

No method has been described with respect to making of the antenna 122 in the description of the other embodiments since the technique for printing the paste is well known. However, the same method as that described above can be used to form the antenna 122 in the other embodiments.

Figure 20D:
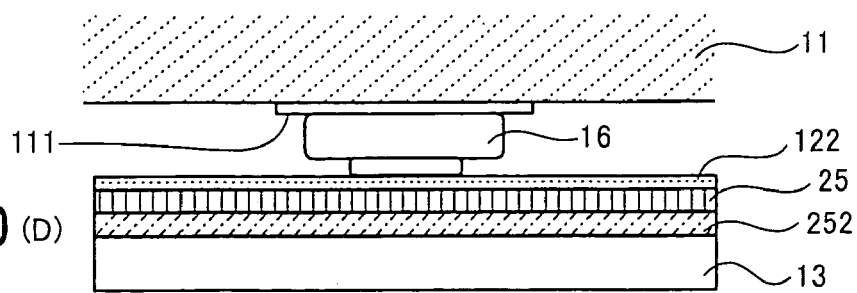

After the antenna 122 has been printed on the hard resin layer 25, the IC chip 11 is mounted with the bumps 16 pressed on the antenna 122, as shown in FIG. 20(D). At this time, sinking of the bumps 16 is prevented thanks to the existence of the hard resin layer 25.

FIGS. 21(A) to 21(D) show a method of manufacturing the RFID tag shown in FIG. 9.

Figure 21A:
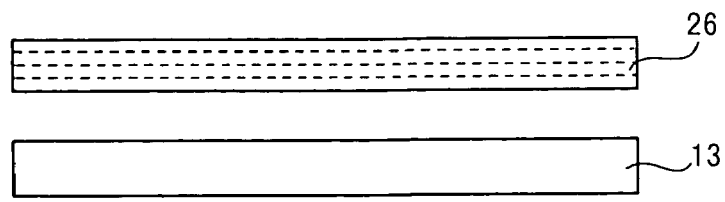
FIGS. 21(A) to 21(D) show a method of manufacturing the RFID tag shown in FIG. 9.
Figure 21B:
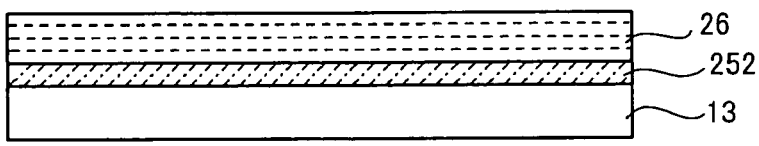
Figure 21C:
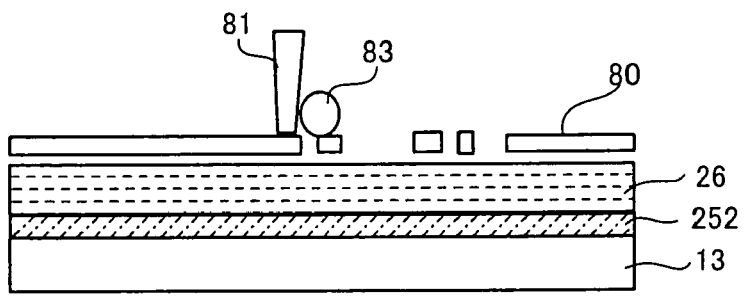
Figure 21D:
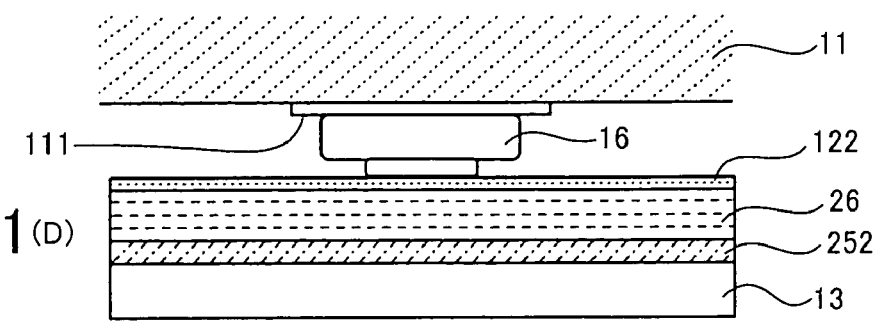

In this case, a PET sheet 26 harder than the base 13 formed of a PET is prepared (FIG. 21(A)). The hard PET sheet 26 is adhered to the base 13 by the adhesive 252 (FIG. 21(B)). As the material of the base 13, a polypropylene-based soft PET is used. As the hard PET sheet 26 adhered to the base 13, a polyester or nylon sheet can be used.

The subsequent manufacturing steps are the same as those shown in FIGS. 20(C) and 20(D). The antenna 122 is printed on the PET sheet 26 (FIG. 21(C)) and the IC chip 11 is mounted (FIG. 21(D)). At the time of this mounting, sinking of the bumps 16 is prevented thanks to the existence of the hard PET sheet 26.

FIGS. 22(A) to 22(D) show a method of manufacturing the RFID tag shown in FIG. 10.

Figure 22:
FIGS. 22(A) to 22(D) show a method of manufacturing the RFID tag shown in FIG. 10.
Figure 22:
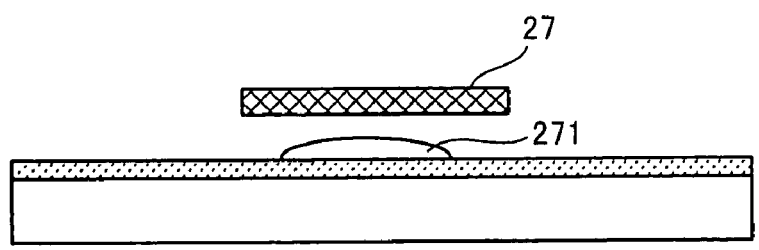
Figure 22:
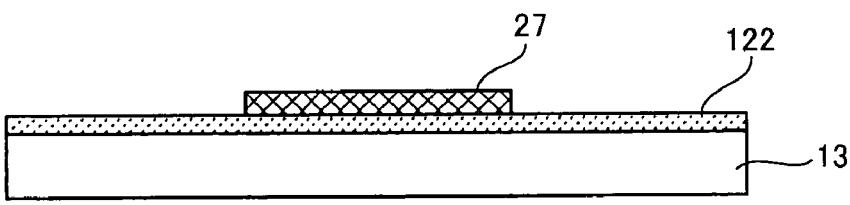
Figure 22:
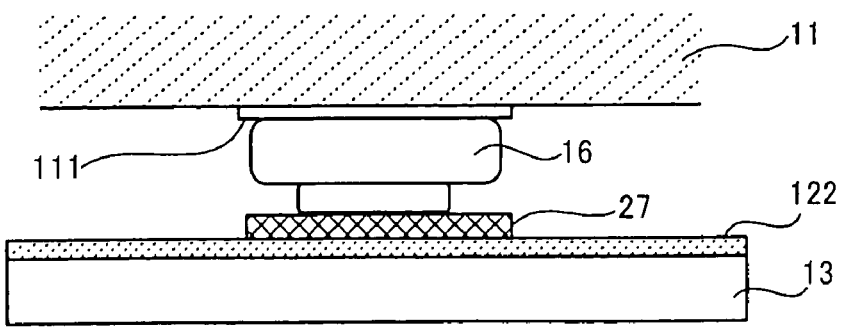

In this case, after the antenna 122 has been printed on the base 13 (FIG. 22(A)), an electroconductive adhesive or a pressure-sensitive adhesive 271 is supplied to the portion of the antenna 122 to be connected to the bumps (FIG. 22(B)) and the metallic supports 27 are adhered to the surface of the antenna 122 (FIG. 22(C)). Thereafter, the IC chip 11 is mounted so that the bumps 16 are placed on the supports 27 (FIG. 22(D)). At the time of this mounting, sinking of the bumps 16 is prevented thanks to the existence of the supports 27.

Figure 23:
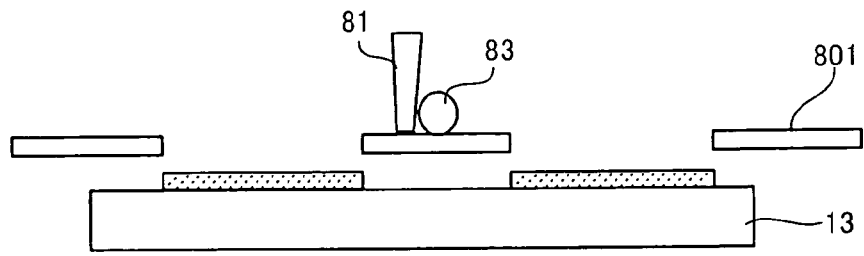
FIGS. 23(A) to 23(C) show a method of manufacturing the RFID tag shown in FIG. 11.
Figure 23:
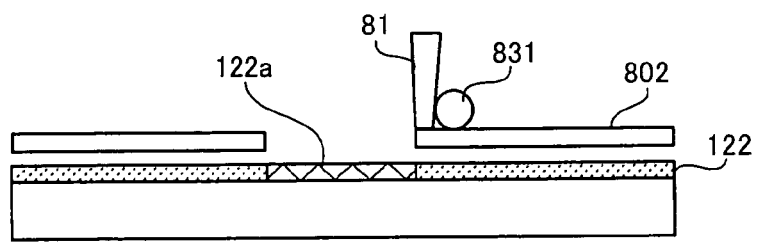
Figure 23:
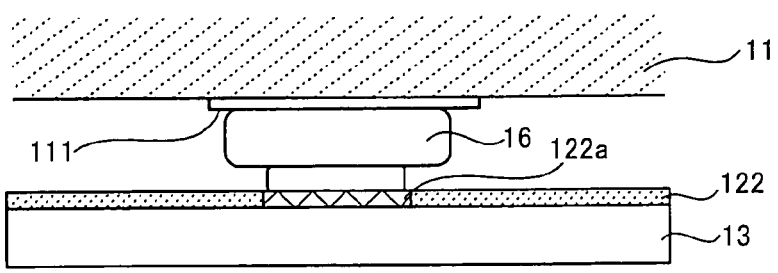

FIGS. 23(A) to 23(C) show a method of manufacturing the RFID tag shown in FIG. 11.

In this case, a printing mask 801 for printing the portion of the antenna other than the bump mount portions to be connected to the bumps is prepared and this portion is printed on the base 13 by using a squeegee 81 and a printing paste 83 in which an Ag filler is blended with a resin material such as an epoxy resin (FIG. 23(A)). Thereafter, a printing mask 802 for printing the bump mount portions of the antenna is prepared and the bump mount portions are printed on the base 13 by using the squeegee 81 and a printing paste 831 in which the Ag filler blending ratio is changed so that the hardness is increased in comparison with the paste 83 used for printing of the portion other than the bump mount portions (FIG. 23(B)). After the antenna 122 including the bump mount portions 122a has been formed in this manner, the IC chip 11 is mounted on the base 13 (FIG. 23(C)). At the time of this mounting, sinking of the bumps 16 is prevented because the bump mount portions 122a to which the bumps 16 are connected have high hardness.

Figure 24:
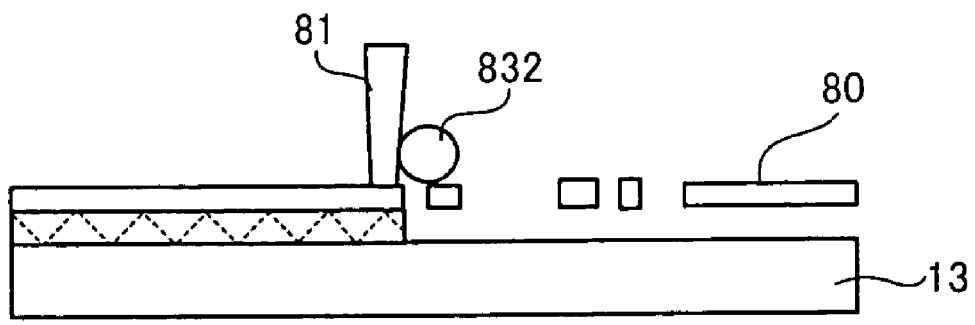
FIGS. 24(A) and 24(B) show a method of manufacturing the RFID tag shown in FIG. 12.
Figure 24:
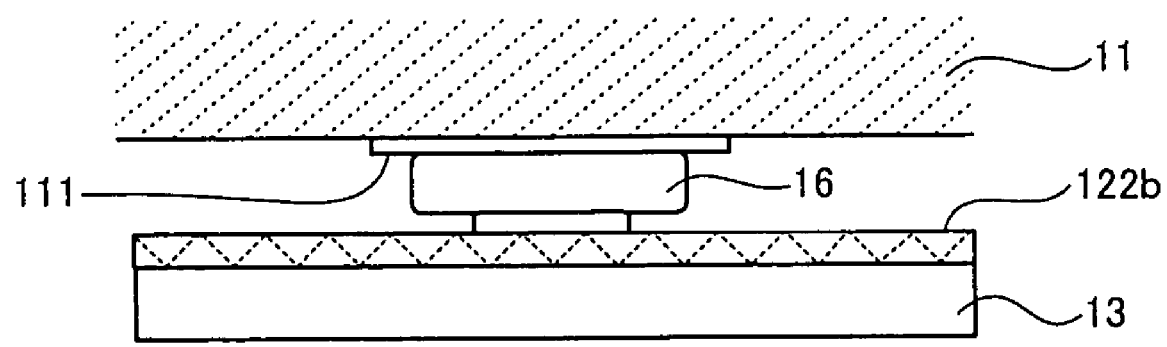

FIGS. 24(A) and 24(B) show a method of manufacturing the RFID tag shown in FIG. 12.

In this case, the antenna is printed on the base 13 by using as the material of the antenna a paste 832 in which a filter such as a Cu, Pd or Ni filler for hardening to a level high enough to effectively limit sinking of the bumps is blended with a resin material such as an epoxy resin as well as an Ag filler for giving the necessary conductivity for the antenna to the resin material (FIG. 24(A)). Thereafter, on the base 13 on which the hard antenna 122b has been formed, the IC chip 11 is mounted so that the bumps 16 formed on the IC chip 11 and the antenna 122b are connected to each other (FIG. 24(B)). At this time, sinking of the bumps 16 is prevented because the antenna 122b has sufficiently high hardness.

What is claimed is:

1. An RFID tag comprising:
 a base;
 an antenna for communication provided on the base;
 a circuit chip connected to the antenna through bumps, the circuit chip performing wireless communication through the antenna,
 wherein the antenna is formed of a paste in which a metallic filler is blended with a resin material; and
 a stopper for limiting sinking of the bumps caused by a pressing force when the circuit chip with the bumps is connected to the antenna is provided adjacent to the bumps.

2. A method of manufacturing an RFID tag, comprising:
 an antenna printing step of printing an antenna for communication on a base by using a paste in which a metallic filler is blended with a resin material;
 a circuit chip mounting step of mounting a circuit chip with bumps capable of performing wireless communication through the antenna, the circuit chip and the antenna being connected to each other through the bumps; and
 a stopper forming step of forming at a position adjacent to the bumps a stopper for limiting sinking of the bumps caused by a pressing force when the circuit chip with the bumps is connected to the antenna.

* * * * *